(12) United States Patent
Kamal

(10) Patent No.: US 6,294,442 B1
(45) Date of Patent: Sep. 25, 2001

(54) METHOD FOR THE FORMATION OF A POLYSILICON LAYER WITH A CONTROLLED, SMALL SILICON GRAIN SIZE DURING SEMICONDUCTOR DEVICE FABRICATION

(75) Inventor: Abu-Hena Mostafa Kamal, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/459,135

(22) Filed: Dec. 10, 1999

(51) Int. Cl.$^7$ .............................. H01L 21/20; H01L 21/36
(52) U.S. Cl. ........................ 438/486; 438/488; 438/509
(58) Field of Search ..................................... 438/255, 398, 438/486, 488

(56) References Cited

U.S. PATENT DOCUMENTS

| | | | |
|---|---|---|---|
| 5,147,813 | 9/1992 | Woo | 437/43 |
| 5,229,631 | 7/1993 | Woo | 257/314 |

OTHER PUBLICATIONS

S. Wolf, Silicon Processing for the VLSI Era, vol. 2—Process Integration, Lattice Press, pp. 318–319, (1990).

M.T. Duffy, et al., LPCVD Polycrystalline Silicon: Growth and Physical Properties of Diffusion–Doped, Ion–Implanted, and Undoped Films, RCA Review, vol. 44, pp. 313–325 (1983).

G. Harbeke, et al., Growth and Physical Properties of LPCVD Polycrystalline Silicon Films, J. Electrochem. Soc., vol. 131, No. 3, pp. 675–682 (1984).

J. Morgiel, et al., In Situ HREM Observations of Crystallization in LPCVD Amorphous Silicon, Mat. Res. Soc. Symp. Proc., vol. 182, pp. 191–194 (1990).

O.S. Panwar, et al., Comparative Study of Large Grains and High–Performance TFTs in Low–Temperature Crystallized LPCVD and APCVD Amorphous Silicon Films, Thin Solid Films 237, pp. 255–267 (1994).

J. Lutzen, et al., Structural Characterization of Ultrathin Nanocrystalline Silicon Films Formed by Annealing Amorphous Silicon, J. Vac. Sci. Technology B 16 (5), pp. 2802–2805 (1998).

S. Shimizu, et al., Gate Electrode Engineering by Control of Grain Growth for High Performance and High Reliable 0.18 $\mu$m Dual Gate CMOS, 1997 Symposium on VLSI Technology Digest of Technical Papers, pp. 107–108 (1997).

Primary Examiner—Charles Bowers
Assistant Examiner—Asok Kumar Sarkar
(74) Attorney, Agent, or Firm—Girard & Equitz LLP

(57) ABSTRACT

Process for the formation of a polysilicon layer with a controlled, small silicon grain size that includes first providing a semiconductor substrate (such as a silicon wafer), followed by the formation of a silicon dioxide layer (such as a gate silicon dioxide layer) on the semiconductor substrate. Next, an amorphous silicon layer is deposited on the silicon dioxide layer. The amorphous silicon layer can be deposited using LPCVD at a temperature in the range of 520° C. to 560° C. and a pressure in the range of 150 mTorr to 250 mTorr. Next, a plurality of silicon crystallites are formed in the amorphous silicon layer by subjecting it to a first RTA cycle at a temperature in the range of 750° C. to 850° C. for a time period of 30 seconds to 90 seconds and a temperature ramp rate of at least 50° C. per second. Finally, the amorphous silicon layer with silicon crystallites is subjected to at least one additional thermal cycle, thereby growing the silicon crystallites into small silicon grains and forming a polysilicon layer with controlled, small silicon grain size.

16 Claims, 2 Drawing Sheets

METHOD FOR THE FORMATION OF A POLYSILICON LAYER WITH A CONTROLLED, SMALL SILICON GRAIN SIZE DURING SEMICONDUCTOR DEVICE FABRICATION

BACKGROUND OF THE INVENTION

1. Field of the Invention

The present invention relates to semiconductor device fabrication methods and, in particular, to methods for the formation of polysilicon layers of controlled, small silicon grain size.

2. Description of the Related Art

Polysilicon layers are frequently employed as the gate electrode in metal-oxide-semiconductor (MOS) devices. See S. Wolf, *Silicon Processing for the VLSI Era, Volume 2—Process Integration,* Lattice Press, 318–319 (1990) and U.S. Pat. Nos. 5,147,813 and 5,229,631 to Been-Jon Woo. As the width of such a polysilicon gate electrode is reduced to 0.18 $\mu$m and beyond, and its height is reduced to 1500 angstroms and below, the morphology (e.g., silicon grain structure) of the polysilicon layer becomes increasingly important in determining various characteristics of the MOS device. Characteristics that can be affected by the silicon grain structure of a polysilicon layer include (i) depletion of dopant in the polysilicon gate electrode due to channeling during ion implantation, as well as dopant diffusion effects in the polysilicon gate electrode; and (ii) boron penetration through the polysilicon gate electrode during ion implantation and a consequent reduction in the integrity of a gate silicon dioxide layer that underlies the polysilicon gate electrode. Furthermore, the relatively high surface roughness of polysilicon layers can be detrimental to the photolithographic patterning processes used in semiconductor device fabrication.

The average surface roughness of as-deposited amorphous silicon layers is known to be lower than the average surface roughness of as-deposited polysilicon layers. In addition, the amorphous nature of these silicon layers reduces channeling during ion implantation. As-deposited amorphous silicon layers are, however, typically subjected to numerous thermal cycles during subsequent semiconductor fabrication processes. These thermal cycles can convert the as-deposited amorphous silicon layer into a polysilicon layer of uncontrolled and relatively large silicon grain size. The growth and morphology of polysilicon and amorphous silicon layers have, therefore, been the subject of extensive investigation. See, for example, M. T. Duffy, et al., *LPCVD Polycrystalline Silicon. Growth and Physical Properties of Diffusion-Doped, Ion-Implanted, and Undoped Films,* RCA Review, Vol. 44, 313–325 (1983); G. Harbeke et al., *Growth and Physical Properties of LPCVD Polycrystalline Silicon Films,* J. Electrochem. Soc., Vol. 131, No. 3, 675–682 (1984); J. Morgiel et al., *In Situ HREM Observations of Crystallization in LPCVD Amorphous Silicon,* Mat. Res. Soc. Symp. Proc. Vol. 182, 191–194 (1990); O. S. Panwar et al., *Comparative Study of Large Grains and High Performance TFTs in Low Temperature Crystallized LPCVD and APCVD Amorphous Silicon Films,* Thin Solid Films 237, 255–267 (1994); and J. Lutzen et al., *Structural Characterization of Ultrathin Nanocrystalline Silicon Films Formed by Annealing Amorphous Silicon,* J. Vac. Sci. Technology B 16(5), 2802–2805 (1998) for further discussions of the subject.

The use of recrystallized amorphous silicon layers as polysilicon gate electrodes has been reported in the literature. See Shimizu et al., *Gate Electrode Engineering by Control of Grain Growth for High Performance and High Reliable 0.18 $\mu$m Dual Gate CMOS,* 1997 Symposium on VLSI Technology, Digest of Technical Papers, 107–108 (1997). However, the relatively high temperatures and long time periods that were employed for recrystallization of the amorphous silicon layers (for example, 850° C. for 20 minutes and 610° C. for 3 hours) can lead to unwanted dopant redistribution in an underlying semiconductor substrate and the formation of undesirably large silicon grains in the resulting polysilicon layer.

Still needed in the field, therefore, is a process for controlling the grain size of polysilicon layers during semiconductor device manufacturing that is compatible with conventional semiconductor device fabrication techniques.

SUMMARY OF THE INVENTION

The present invention provides a process for the formation of a polysilicon layer with a controlled, small silicon grain size during semiconductor device fabrication. The controlled, small silicon grain size (for example, less than 50 nm for a 0.18 $\mu$m process technology and less than 30 nm for a 0.10 $\mu$m process technology) decreases channeling through the polysilicon layer during subsequent ion implantation processes. Such a decrease in channeling provides for a beneficial reduction in boron penetration and, therefore, an increase in gate silicon dioxide layer integrity. The presence of small silicon grains in the polysilicon layer is also believed to provide for a desirable reduction in polysilicon dopant depletion effects.

Processes according to the present invention include steps of first providing a semiconductor substrate (e.g., a silicon wafer), followed by the formation of a silicon dioxide layer (e.g., a gate silicon dioxide layer) thereon. Next, an amorphous silicon layer is deposited on the silicon dioxide layer. A plurality of silicon crystallites are then formed in the amorphous silicon layer by subjecting it to a first thermal cycle. Finally, the amorphous silicon layer and silicon crystallites therein are subjected to at least one additional thermal cycle, thereby growing the silicon crystallites into small silicon grains and converting the amorphous silicon layer into a polysilicon layer with controlled, small silicon grain size.

In one embodiment of processes according to the present invention, a semiconductor substrate is first provided, followed by the formation of a gate silicon dioxide layer thereon. An amorphous silicon layer is then deposited on the gate silicon dioxide layer using a low pressure chemical vapor deposition technique at a temperature in the range of 520° C. to 560° C. and a pressure in the range of 150 mTorr to 250 mTorr. The amorphous silicon layer has a typical thickness in the range of 1000 angstroms to 2500 angstroms. A plurality of silicon crystallites (i.e., small silicon grains) are subsequently formed in the amorphous silicon layer by subjecting the amorphous silicon layer to a first thermal cycle that includes a temperature ramp rate of at least 50° C. per second and an annealing step at a temperature in the range of 740° C. to 760° C. for a time period of 30 seconds to 90 seconds. The amorphous silicon layer with silicon crystallites therein is then patterned to form a patterned amorphous silicon layer still containing silicon crystallites therein. The patterned amorphous silicon layer includes silicon gate electrodes with a width in the range of 0.10 $\mu$m to 0.25 $\mu$m. Finally, the patterned amorphous silicon layer with silicon crystallites is subjected to at least one additional thermal cycle. The additional thermal cycle grows the silicon crystallites into small silicon grains and converts the amorphous silicon layer into a polysilicon layer with controlled, small silicon grain size in the range of 20 nm to 50 nm.

In processes, according to the present invention, an amorphous silicon layer is subjected to a first thermal cycle (for example, using a rapid thermal anneal [RTA] process that does not alter dopant distribution in the underlying semiconductor substrate) in order to form small silicon crystallites in the amorphous silicon layer. The amorphous silicon layer retains the low surface roughness (e.g., no more than 15 angstroms of rms surface roughness or less than 1% of the amorphous silicon layer thickness) required for photolithography even after the first thermal cycle. Upon being subjected to at least one additional thermal cycle during subsequent semiconductor device fabrication, such as silicon dioxide sidewall spacer formation, silicon nitride sidewall spacer formation, or dopant activation processes, the silicon crystallites grow into small silicon grains. In essence, the silicon crystallites act as seeds for the formation of small silicon grains during these subsequent thermal cycles. The amorphous layer is, therefore, converted into a polysilicon layer containing small silicon grains. Since the density and size of the silicon crystallites determine those of silicon grains in the polysilicon layer, polysilicon layers with a controlled, small silicon grain size can be formed. The polysilicon layer formed in accordance with the present invention also has the low surface roughness required for photolithography (such as less than 1% of the polysilicon layer thickness) even after being subjected to the additional thermal cycles.

The presence of small silicon grains in the polysilicon layer improves dopant depletion effects in the polysilicon layer. It also improves gate silicon dioxide layer integrity by reducing channeling during ion implantation. The presence of small silicon grains, therefore, enhances the characteristics of the semiconductor devices being fabricated. Processes according to the present invention are simple and can be implemented using conventional semiconductor device fabrication techniques.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which.

DETAILED DESCRIPTION OF THE INVENTION

Figure 1:
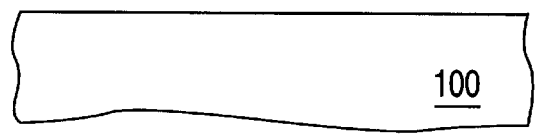
FIGS. 1–6 are cross-sectional views illustrating stages in a process in accordance with the present invention.
Figure 2:
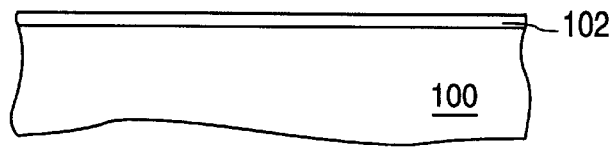

FIGS. 1–6 illustrate stages in a process according to the present invention. The process includes the steps of first providing a semiconductor substrate 100 (e.g., a silicon substrate such as a silicon wafer), as illustrated in FIG. 1, followed by the formation of a silicon dioxide ($SiO_2$) layer 102 thereon. Silicon dioxide layer 102 can be, for example, a gate silicon dioxide layer with a thickness in the range of 30 angstroms to 50 angstroms. Silicon dioxide layer 102 can be formed using conventional techniques, such as thermal oxidation. The resultant structure is shown in FIG. 2.

Figure 3:
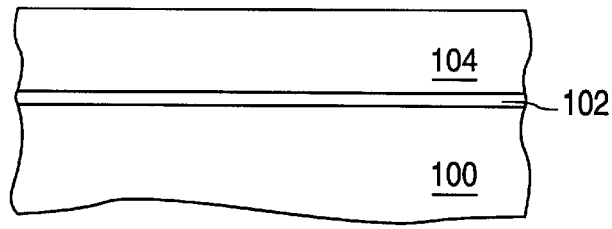

Next, an amorphous silicon layer 104 is deposited on the silicon dioxide layer 102, as illustrated in FIG. 3. Amorphous silicon layer 104 can be formed using, for example, conventional low pressure chemical vaporization (LPCVD) amorphous silicon deposition techniques. At a temperature of 580° C., a silicon layer deposited using LPCVD is typically a mixture of amorphous silicon and a significant amount of polysilicon. Therefore, processes according to the present invention preferably employ LPCVD processes which deposit an amorphous silicon layer at a temperature of less then 580° C. At temperatures below 560° C., silicon layers deposited using LPCVD techniques are typically 95% amorphous in nature. While amorphous silicon layers can also be deposited using LPCVD at temperatures of less than 520° C., the deposition rate will be low, leading to low LPCVD equipment throughput, and consequently relatively few wafers will be processed per unit time. It is, therefore, more preferred that the amorphous silicon layer be deposited using an LPCVD technique at a temperature in the range of 520° C. to 560° C. Typical pressures for the deposition of an amorphous layer using LPCVD techniques are in the range of 150 mTorr to 350 mTorr.

The thickness of amorphous silicon layer 104 depends on the semiconductor device fabrication technology being employed in conjunction with processes according to the present invention. A typical thickness of amorphous silicon layer 104 for a 0.25 µm fabrication technology is 2500 angstroms, while for 0.18 µm and 0.10 µm fabrication technologies a typical thickness is 2000 angstroms and 1000 angstroms, respectively.

It should be noted that amorphous silicon layers have an inherently low surface roughness, which facilitates subsequent photolithography processing, such as photolithographic patterning to form a patterned amorphous silicon layer. As is explained in detail below, in processes according to the present invention, the amorphous silicon layer 104 is subjected to subsequent thermal cycles to first create silicon crystallites in the amorphous silicon layer and then to form a polysilicon layer with controlled, small silicon grains. However, each of these subsequent layers retain a low surface roughness due to the initial low surface roughness nature of amorphous silicon layer 104.

Figure 4:
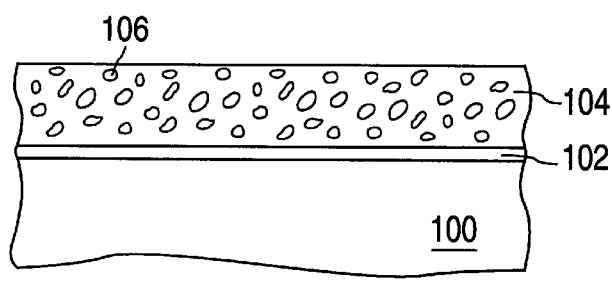

Next, amorphous silicon layer 104 is subjected to a first thermal cycle in order to form a plurality of silicon crystallites 106 in the amorphous silicon layer, while maintaining an amorphous silicon layer 104 with a low surface roughness. The temperature, temperature ramp rate, and time period of the first thermal cycle are critical since these conditions, along with the amorphous silicon deposition conditions, are factors that determine the density and size of silicon crystallites 106 that are formed in the amorphous silicon layer 104. The resultant structure is shown in FIG. 4. The silicon crystallites 106 can be formed, for example, using a short rapid thermal anneal (RTA) process at a temperature in the range of 750° C. to 850° C. for a time period of 30 seconds to 90 seconds. As described below, the silicon crystallites 106 formed in this step will grow into silicon grains during subsequent semiconductor fabrication thermal cycles (e.g., during silicon nitride or silicon dioxide spacer sidewall formation or dopant activation anneals). In the absence of this step to form silicon crystallites, subsequent thermal cycles would result in the unpredictable and, thus, uncontrollable growth of relatively large silicon grains. By controlling the density of silicon crystallites formed during this step, the density, and thus the size, of the subsequently formed silicon grains is also controlled.

A short rapid thermal anneal (RTA) is preferred since such a thermal cycle will form a plurality of silicon crystallites without causing unwanted dopant redistribution in the semiconductor substrate (for example, unwanted redistribution of boron dopant present in a well region of the semiconductor substrate). For the same reason, the ramp rate of the first thermal cycle is preferably as fast as possible given equipment constraints. Conventional RTA equipment can attain a ramp rate of from 50° C. per second to at least 100° C. per second.

Figure 5:
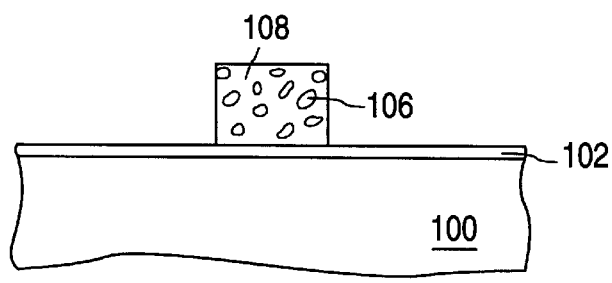
Figure 6:
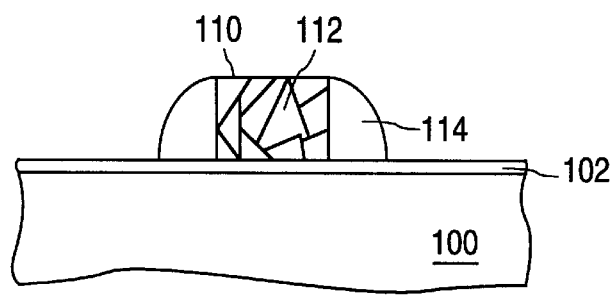

Next, the amorphous silicon layer 104 is patterned to form a patterned amorphous silicon gate layer 108 containing silicon crystallites 106, as illustrated in FIG. 5. The patterning of amorphous silicon layer 104 can be accomplished using conventional photolithographic and etching techniques. If desired, this patterning step can be performed prior to subjecting the amorphous silicon layer to the first thermal cycle. The patterned amorphous silicon layer 108, and the silicon crystallites 106 therein, are then subjected to at least one additional thermal cycle to form a patterned polysilicon layer 110 with controlled, small silicon grains 112 and a low surface roughness. The at least one additional thermal cycle is preferably a thermal cycle associated with conventional semiconductor device fabrication, such as the formation of 0.1 μm wide silicon nitride sidewall spacers 114 (shown in FIG. 6) at a temperature in the range of 750° C. to 800° C. or the thermal activation of subsequently implanted dopants (not shown).

The preferred size of the small silicon grains 112 depends on the semiconductor device fabrication technology being employed. For a 0.8 μm fabrication technology, it is preferred that the small silicon grains be in the size range of 20 nm to 50 nm, while for a 0.1 μm fabrication technology in the size range of 20 nm to 30 nm. The objective is to provide enough small silicon grains so that ion implant channeling from the polysilicon layer to the underlying silicon dioxide layer 102 is prevented due to the absence of a single continuous grain boundary therebetween. Another objective is to provide enough small silicon grains such that dopant redistribution is facilitated and polysilicon depletion effects minimized.

In order to demonstrate the advantages of processes according to the present invention, 4 Mb SRAM devices were fabricated on a series of p-type (100) silicon wafers. These 4 Mb SRAM devices were fabricated using a 0.18 μm fabrication technology that included the formation of shallow trench isolation regions, as well as p-well regions and n-well regions, in the silicon wafers. The 0.18 μm semiconductor fabrication technology also included the formation of a 40 angstrom thick gate silicon dioxide layer on the silicon wafers. The gate silicon dioxide layer was grown in wet ambient at 750° C. and annealed at 900° C. in $N_2O$ for 20 minutes. Amorphous silicon and/or polysilicon layers were then deposited under the conditions discussed below. Some wafers also received a first thermal cycle according to the present invention. Conventional semiconductor fabrication techniques were subsequently used to define sidewall spacers, source and drain regions, contacts and metal layers. The gross $I_{dd}$ (gross leakage current from the highest potential to ground of the device), continuity and functionality of each of the 4 Mb SRAM devices on these wafers were tested.

Table 1 lists the average and minimum number of failing 4 Mb SRAM bits for 3 lots of wafers (i.e., lots A, B and C) processed using an LPCVD amorphous silicon deposition in a Semitool VTP-1 500 LPCVD furnace at 550° C. and 200 mTorr, but without a subsequent step to form a plurality of silicon crystallites in the amorphous layer. It is speculated, without being bound, that the relatively high number of failing bits for these 4 Mb SRAM devices is due to the presence of polysilicon dopant depletion effects.

TABLE 1

| Lot | Average Number Failing Bits on each of 4 Wafers | Minimum Number Failing Bits on each of 4 Wafers |
| --- | --- | --- |
| A | >50,000 | 3300 |
| B | — | 2310 |
| C | — | 1874 |

Table 2 lists, by wafer number, the pertinent processing conditions, number of failing bits and comments for a series of 4 Mb SRAM devices. For those wafers which received a rapid thermal anneal, the annealing was carried out in an Applied Materials, Centura 5200 RTP system at a ramp rate of 50° C. per second.

All the 4 Mb SRAM devices on wafers 14 and 15 (i.e., the 4 Mb SRAM devices fabricated by depositing a mixed amorphous silicon and polysilicon layer at 580° C. and 200 mTorr, and then subjecting that layer to a first thermal cycle of 750° C. for 60 seconds) exhibited continuity failures. These failures indicate that a mixed amorphous silicon (a-Si) and polysilicon (poly-Si) layer is not suitable for 4 Mb SRAM device fabrication, even when the layer is subjected to a first thermal cycle designed to form silicon crystallites.

TABLE 2

| 4 Mb SRAM Device Wafer # | Amorphous Silicon or Polysilicon Layer Deposition Conditions | RTA Conditions | Number of Failing Bits for 4 Mb Devices that Passed Idd and Continuity Testing | Comments |
| --- | --- | --- | --- | --- |
| 3 | a-Si at 550° C. and 200 mTorr | 650° C. for 60 seconds | N/A | Exhibited undesirably large NMOS Vt Range (see FIG. 7) |
| 4 | a-Si at 550° C. and 200 mTorr | 750° C. for 60 seconds | avg. = 830 minimum = 649 | |
| 6 | a-Si at 550° C. and 200 mTorr | 750° C. for 60 seconds | avg. = 944 minimum = 680 | |
| 8 | a-Si at 550° C. and 200 mTorr | None | mininium = approx. 2500 | |

TABLE 2-continued

| 4 Mb SRAM Device Wafer # | Amorphous Silicon or Polysilicon Layer Deposition Conditions | RTA Conditions | Number of Failing Bits for 4 Mb Devices that Passed Idd and Continuity Testing | Comments |
|---|---|---|---|---|
| 9 | a-Si at 550° C. and | None | minimum = approx. 2500 | |
| 11 | a-Si at 550° C. and 300 mTorr | 750° C. for 60 seconds | avg. = 8140 minimum = 839 | |
| 12 | a-Si at 550° C. and 300 mTorr | 750° C. for 60 seconds | avg. = 1600 minimum = 869 | |
| 14 | Mixed a-Si and Poly-Si at 580° C. and 200 mTorr | 750° C. for 60 seconds | N/A | All die failed continuity test |
| 15 | Mixed a-Si and Poly-Si at 580° C. and 200 mTorr | 750° C. for 60 seconds | N/A | All die failed continuity test |
| 19 | Poly-Si at 625° C. and 200 mTorr | None | avg. = 91 minimum = 1 | undesirable surface roughness |
| 23 | Poly-Si at 625° C. and 200 mTorr | None | avg. = 254 minimum = 1 | undesirable surface roughness and PMOS Vt shift (see FIG. 8) |

The 4 Mb SRAM devices of wafers 19 and 23 were formed using polysilicon layers deposited at 625° C. and 200 mTorr. The minimum number of failing bits was 1, with average values of 91 and 254 for wafers 19 and 23, respectively. The polysilicon layers used to form these devices, however, had the undesirably high surface roughness that is associated with as-deposited polysilicon layers. It is highly likely that the surface roughness of such as deposited deposited polysilicon layers would be detrimental to fabrication technologies below 0.18 μm.

The 4 Mb SRAM devices of wafers 4 and 6 were fabricated by depositing an amorphous silicon layer and then subjecting the amorphous silicon layer to a rapid thermal anneal at 750° C. for 60 seconds before pattering the amorphous silicon layer to form a patterned amorphous silicon layer. In other words, the 4 Mb SRAM devices of wafers 4 and 6 were fabricated using a process in accordance with the present invention. The minimum number of failing bits were 449 and 680, and average number of failing bits were 830 and 944 for wafers 4 and 6, respectively. The minimum number of failing bits for these wafers was, therefore, at least ¼ that of the 4 Mb SRAM devices listed in Table 1. Since the only pertinent difference in processing between wafers 4 and 6 and the lots A, B and C listed in Table 1 was the additional step of forming small crystallites by subjecting the amorphous silicon layer to a first thermal cycle (i.e., a rapid thermal anneal), it is speculated that the improvement in the number of failing bits is due to a change in polysilicon layer morphology. It should also be noted that the 4 Mb SRAM devices of wafers 8 and 9 (fabricated by depositing an amorphous silicon layer, but without a first thermal cycle designed to form a plurality of small crystallites) had minimum numbers of failing bits that are similar to those of lots A, B and C.

Approximately 40 4 Mb SRAM devices from each of wafers 11 and 12 (a-Si deposited at 550° C., 300 mTorr and annealed at 750° C. for 60 seconds) passed the $I_{dd}$ and continuity tests but failed functionality testing. The minimum numbers of failing bits were 839 and 869 for wafers 11 and 12, respectively. It is known that for a given amorphous silicon layer deposition temperature, a higher pressure results in a higher deposition rate, which in turn provides less time for crystallite formation. Therefore, it is speculated that the relatively high bit failure rate for wafers 11 and 12, in comparison to wafers 4 and 6, is due to the formation of fewer silicon crystallites during the RTA anneal step.

Figure 7:
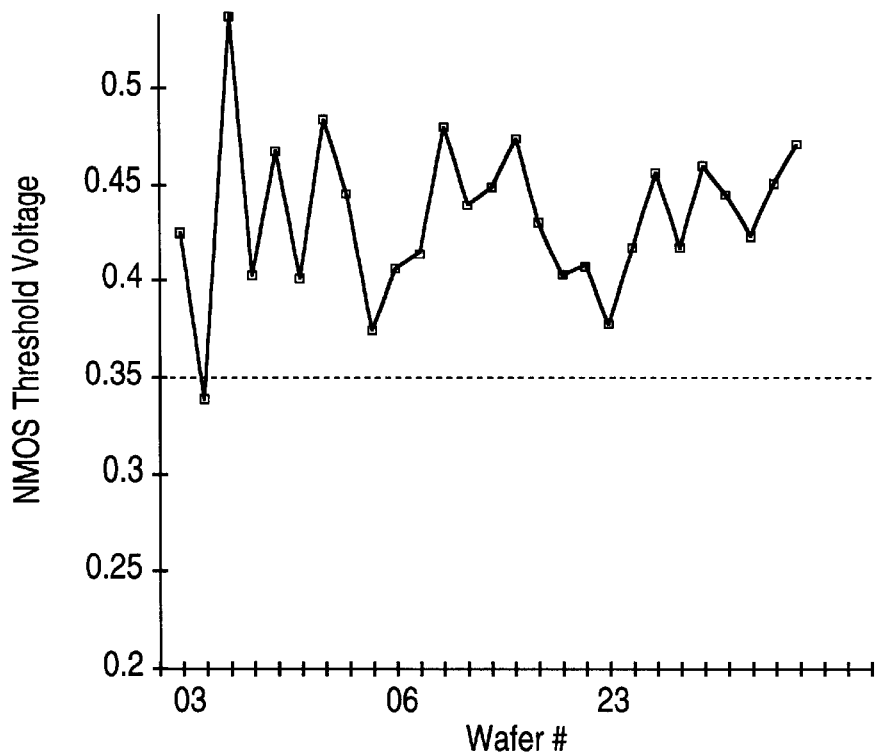
FIG. 7 is a graph of the NMOS threshold voltage for narrow-channel (i.e., 0.28 µm wide) transistors on three wafers. The transistors on each of the three wafers were fabricated using different processes.

FIG. 7 is a graph of threshold voltages, measured on 0.28 μm narrow channel NMOS transistors, on three of the wafers of Table 2. Nine measurements were made across each wafer. The width and length of the transistors were 0.28 μm and 1.0 μm respectively. Since 0.28 μm is a relatively narrow width, the morphology of the polysilicon layer is believed to control the threshold voltage ($V_{th}$) of these narrow channel transistors. The threshold voltage range for wafers 6 and 23 were similar, but the threshold voltage range for wafer 3 was much greater, with one transistor exhibiting a threshold voltage of 0.537 volts. This high threshold voltage could be due to a polysilicon depletion effect caused by large silicon grains.

Figure 8:
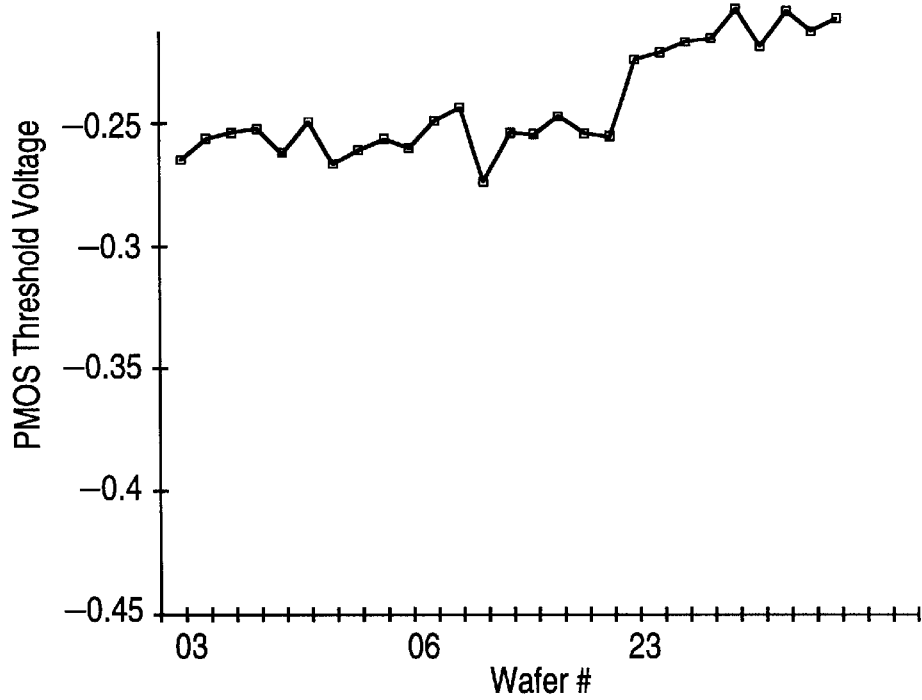
FIG. 8 is a graph of the PMOS threshold voltage for narrow-channel (i.e., 0.28 µm wide) transistors on three wafers. The transistors on each of the three wafers were fabricated using different processes.

FIG. 8 shows the threshold voltages of 0.28 μm by 1.0 μm PMOS transistors on the same three wafers as FIG. 7. The threshold voltage of wafer 23 is reduced, in comparison to the other wafers, by approximately 50 mV. This reduction in threshold voltage is believed to be due to boron penetration through the polysilicon layer. Since wafer 6 does not show any such reduction in $V_{th}$, the process used to fabricate the 4 Mb SRAM devices of wafer 6 is considered the most optimum based on the data in FIGS. 7 and 8.

The data discussed above indicates that processes according to the present invention can reduce the bit failure rate and improve the threshold voltage characteristics of 4 Mb SRAM semiconductor devices. 4 Mb SRAM bit failure rates and threshold voltage characteristics are, however, predictive of similar benefits in other semiconductor devices, such as microprocessors and logic devices.

It should be understood that various alternatives to the embodiments of the invention described herein may be employed in practicing the invention. It is intended that the following claims define the scope of the invention and that methods within the scope of these claims and their equivalents be covered thereby.

What is claimed is:

1. A polysilicon layer forming method for formation of a polysilicon layer with controlled silicon grain size during a semiconductor device fabrication operation including semiconductor device fabrication steps, the polysilicon layer forming method comprising the steps of:

(a) providing a semiconductor substrate;

(b) forming a silicon dioxide layer on the surface of the semiconductor substrate;

(c) depositing an amorphous silicon layer having a thickness in the range of 1000 angstroms to 2500 angstroms on the silicon dioxide layer;

(d) forming a plurality of silicon crystallites in the amorphous silicon layer by subjecting the amorphous silicon layer to a first thermal cycle; and (e) after forming the silicon crystallites, performing one of the semiconductor device fabrication steps in a manner subjecting the amorphous silicon layer and the silicon crystallites to at least one additional thermal cycle, thereby growing the silicon crystallites into silicon grains having silicon grain size not greater than 50 nm and forming a polysilicon layer with controlled silicon grain size not greater than 50 nm.

2. The method of claim 1 wherein the depositing step deposits the amorphous silicon layer using a low pressure chemical vapor deposition technique at a temperature of less than 580° C. and a pressure in the range of 150 mTorr to 250 mTorr.

3. The method of claim 2 wherein the depositing step deposits the amorphous silicon layer at a temperature in the range of 520° C. to 560° C.

4. The method of claim 3 wherein the depositing step deposits the amorphous silicon layer at a temperature of 550° C.

5. The method of claim 2 wherein the first thermal cycle has a temperature ramp rate of at least 50° C. per second and includes an annealing step at a temperature in the range of 750° C. to 850° C. for a time period in the range of 30 seconds to 90 seconds.

6. The method of claim 2 wherein the first thermal cycle has a temperature ramp rate of at least 50° C. per second and includes an annealing step at a temperature in the range of 740° C. to 760° C. for a time period in the range of 54 seconds to 60 seconds.

7. The method of claim 2 wherein the depositing step deposits an amorphous silicon layer with an rms surface roughness of less than 15 angstroms.

8. The method of claim 2 wherein the depositing step deposits an amorphous silicon layer with a surface roughness of less than 1% of the thickness of the amorphous silicon layer.

9. The method of claim 1 wherein the silicon grains grown during step (e) have silicon grain size in the range from 20 nm to 50 nm.

10. The method of claim 1 wherein the silicon grains grown during step (e) have silicon grain size in the range from 20 nm to 30 nm.

11. The method of claim 1, further including the step of patterning the amorphous silicon layer after step (c) but prior to step (d).

12. The method of claim 1, further including the step of patterning the amorphous silicon layer with the silicon crystallites after step (d) but prior to step (e).

13. A polysilicon layer forming method for formation of a polysilicon layer with controlled silicon grain size during a semiconductor device fabrication operation including semiconductor device fabrication steps, the polysilicon layer forming method comprising the steps of:

(a) providing a semiconductor substrate;

(b) forming a silicon dioxide layer on the surface of the semiconductor substrate;

(c) depositing an amorphous silicon layer on the silicon dioxide layer;

(d) forming a plurality of silicon crystallites in the amorphous silicon layer by subjecting the amorphous silicon layer to a first thermal cycle; and (e) after forming the silicon crystallites, performing one of the semiconductor device fabrication steps in a manner subjecting the amorphous silicon layer and the silicon crystallites to at least one additional thermal cycle, thereby growing the silicon crystallites into silicon grains having silicon grain size not greater than 50 nm and forming a polysilicon layer with controlled silicon grain size not greater than 50 nm, wherein said one of the semiconductor device fabrication steps performed during step (e) is a step associated with the formation of silicon dioxide/silicon nitride sidewall spacers during the semiconductor device fabrication.

14. A polysilicon layer forming method for the formation of a polysilicon layer with a controlled silicon grain size during a semiconductor device fabrication operation including semiconductor device fabrication steps, the polysilicon layer forming method comprising the steps of:

(a) providing a semiconductor substrate;

(b) forming a gate silicon dioxide layer on the surface of the semiconductor substrate;

(c) depositing an amorphous silicon layer on the gate silicon dioxide layer using a low pressure chemical vapor deposition technique at a temperature in the range of 520° C. to 560° C. and a pressure in the range of 150 mTorr to 250 mTorr, the amorphous silicon layer having a thickness in the range of 1000 angstroms to 2500 angstroms;

(d) forming a plurality of silicon crystallites in the amorphous silicon layer by subjecting the amorphous silicon layer to a first thermal cycle that includes a temperature ramp rate of at least 50° C. per second and an annealing step at a temperature in the range of 740° C. to 760° C. for a time period of 30 seconds to 90 seconds;

(e) patterning the amorphous silicon layer with the silicon crystallites therein to form a patterned amorphous silicon layer with said silicon crystallites therein, the patterned amorphous silicon layer including silicon gate electrodes with a width in the range of 0.10 $\mu$m to 0.25 $\mu$m ; and (f) after step (e), performing one of the semiconductor device fabrication steps in such a manner as to subject the patterned amorphous silicon layer with said silicon crystallites to at least one additional thermal cycle, thereby converting said patterned amorphous silicon layer with said silicon crystallites into a patterned polysilicon layer with silicon grains of controlled size, wherein said silicon grains have grain size not greater than 50 nm.

15. The method of claim 14, wherein said silicon grains of controlled size have grain size in the range from 20 nm to 50 nm.

16. The method of claim 15, wherein said silicon grains of controlled size have grain size in the range from 20 nm to 30 nm.

* * * * *